(12) United States Patent
Graetz

(10) Patent No.: US 6,356,120 B1
(45) Date of Patent: Mar. 12, 2002

(54) ELECTRONIC CIRCUIT CONFIGURATION

(75) Inventor: Thoralf Graetz, Dresden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/394,196

(22) Filed: Sep. 10, 1999

(30) Foreign Application Priority Data

Sep. 10, 1998 (DE) .......................................... 198 41 446

(51) Int. Cl.$^7$ ............................................ G01R 19/00
(52) U.S. Cl. ........................................... 327/55; 327/57
(58) Field of Search ........................... 327/51, 52, 54, 327/55, 57, 65–67, 89, 563; 365/205, 207, 208, 154; 330/252, 253, 260

(56) References Cited

U.S. PATENT DOCUMENTS

| | | | | |
|---|---|---|---|---|
| 4,586,166 A | * | 4/1986 | Shah | 365/154 |
| 4,843,264 A | * | 6/1989 | Galbraith | 327/55 |
| 4,871,933 A | * | 10/1989 | Galbraith | 327/52 |
| 5,017,815 A | * | 5/1991 | Shah et al. | 327/55 |
| 5,508,644 A | * | 4/1996 | Branson et al. | 327/57 |
| 5,619,467 A | * | 4/1997 | Sim | 365/208 |

OTHER PUBLICATIONS

"Halbleiter–Schaltungstechnik", U. Tietze et al., Springer–Verlag Berlin, Heidelberg, New York, 1974, pp. 401–402.

* cited by examiner

*Primary Examiner*—Kenneth B. Wells
*Assistant Examiner*—Paul Dinh
(74) *Attorney, Agent, or Firm*—Herbert L. Lerner; Laurence A. Greenberg; Werner H. Stemer

(57) ABSTRACT

An electronic circuit configuration having two lines and a detector device which is allocated to the two lines. The circuit configuration detects a potential difference on the lines and controls a change in the line potentials in response to this. Each line is allocated a switch that is driven by the detector device and, after actuation by the detector device, connects the potential of an associated line to a reference-ground potential that is coupled to the switch.

4 Claims, 1 Drawing Sheet

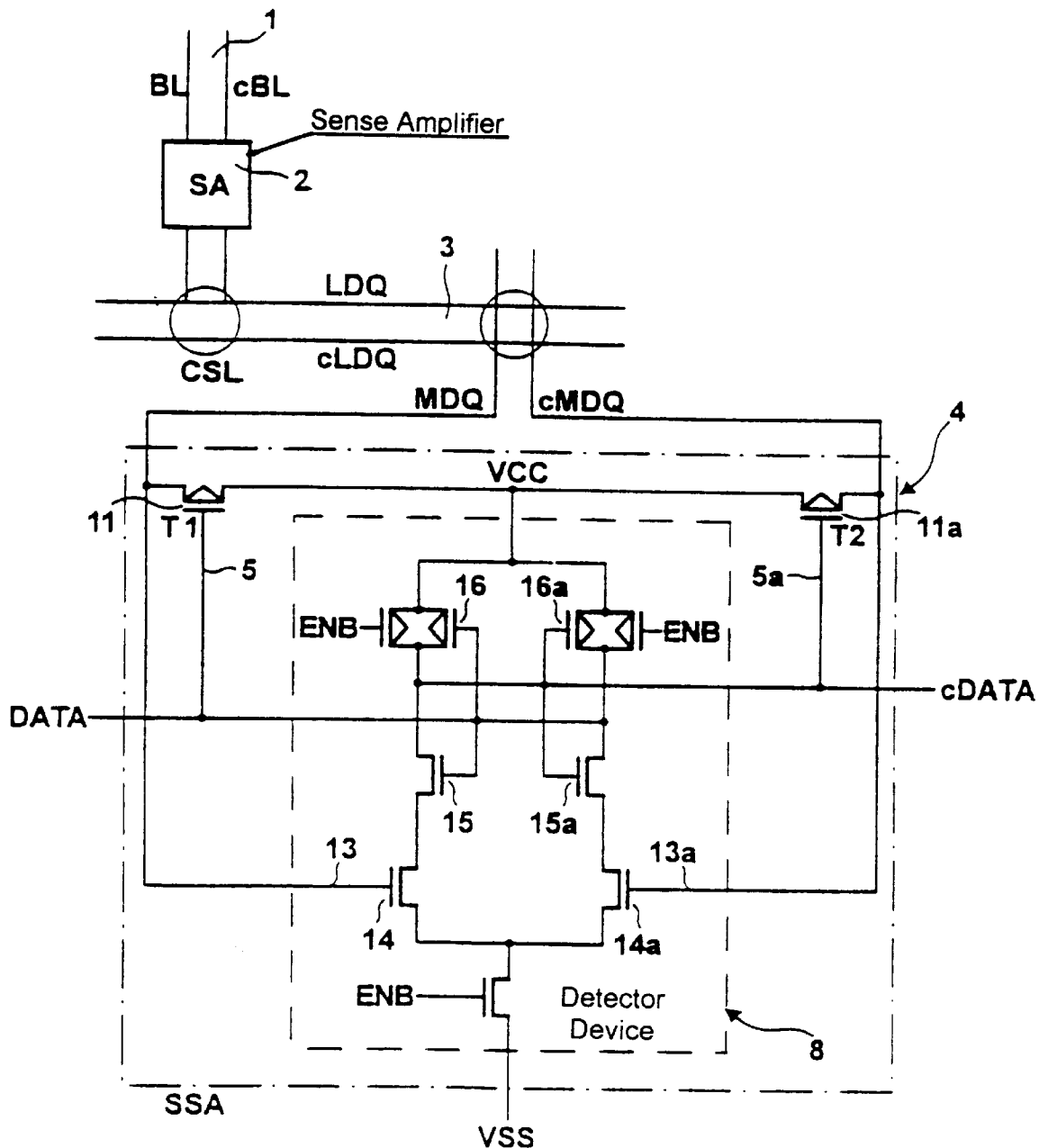

ELECTRONIC CIRCUIT CONFIGURATION

BACKGROUND OF THE INVENTION

FIELD OF THE INVENTION

The invention relates to an electronic circuit configuration having two lines and a detector device that is allocated to the two lines. The electronic circuit configuration detects a potential difference on the lines and controls a change in the line potentials in response to this.

Such a circuit configuration is used, in particular, in synchronous dynamic semiconductor memories of the random access type (SDRAM), for example when reading an SDRAM memory cell in which a potential difference on paired complementary lines needs to be assessed. In this case, the paired lines, which are connected to a sense amplifier (SA) for the memory cell, are firstly precharged to a predetermined reference-ground potential. To assess the data content, the sense amplifier is connected to the memory cells via paired complementary lines, and, depending on the data content, one of the two complementary lines is discharged. The potential difference produced between the two complementary lines as a result of one of the lines discharging is assessed by a secondary sense amplifier (SSA). After the assessment, the data content is output in amplified form via outputs of the secondary sense amplifier. After this procedure, the two complementary lines are precharged to the reference-ground potential again for the next read cycle. This charging process is faster the smaller the extent to which one of the two complementary lines was discharged. Limiting the discharge of the complementary lines produces a shorter waiting time in the charging procedure for the complementary lines and thus, in principle, results in faster read procedures.

In a previously used circuit configuration, two different approaches were used for limiting the discharge of the complementary lines during the assessment process. First, the connection between the complementary lines and the upstream sense amplifier was interrupted as soon as the potential difference state of the lines had been assessed by the secondary sense amplifier, but this meant intervening in the control of the read cycle. Second, the discharging of the complementary line was limited to a particular potential locally at the secondary sense amplifier SSA. This was achieved by coupled differential amplifiers, which limit the potential difference on the complementary lines, but these entail comparatively high circuit complexity.

SUMMARY OF THE INVENTION

It is accordingly an object of the invention to provide an electronic circuit configuration which overcomes the above-mentioned disadvantages of the prior art devices of this general type, whose circuitry is significantly simplified.

With the foregoing and other objects in view there is provided, in accordance with the invention, an electronic circuit configuration, including two lines; a detector device connected to the two lines for detecting a potential difference on the two lines and controls a chance in line potentials in response to the potential difference; and switches coupled to a reference-ground potential, each of the two lines connected to one of the switches and the switches are connected to and driven by the detector device and, after being actuated by the detector device, each of the switches connects a potential of an associated line of the two lines to the reference-ground potential.

The object is achieved by the circuit configuration in that the complementary lines are allocated a switch which is driven by the detector device and, after actuation by the detector device, connects the potential of the respective complementary line to a reference-ground potential, which is coupled to the switch, as soon as the potential difference has been assessed by the detector device. In this way, the discharge of the complementary line is minimized and hence the time interval until further assessment can take place is reduced. This produces significantly faster read procedures.

In a particularly preferred development of the invention, the switches for charging the complementary lines are formed of terminal transistors whose gate connections or base connections are driven by the detector device and whose electrode connections (collector and source, emitter and drain) are coupled firstly to the associated line and secondly to the reference-ground potential (VCC). The advantage of this is that, in total, only two further transistors are necessary and the high circuit complexity of differential amplifiers is dispensed with, which results in a considerable saving in area on the wafer.

According to a further preferred embodiment of the invention, the detector device for the potential difference on the two complementary lines is formed by a signal memory circuit (latch circuit) whose inputs are coupled to the two complementary lines and whose outputs are coupled directly to the control connections (gates) of the switches, which apply a reference-ground potential to the complementary lines. Hence, the switches represent merely a slight addition to the standard circuit, therefore, the circuit configuration can be produced very inexpensively.

According to a particularly preferred embodiment of the invention, in which the circuit is used in a synchronous dynamic semiconductor memory of the random access type (SDRAM), a large cost saving can be achieved by dispensing with the differential amplifiers.

Other features which are considered as characteristic for the invention are set forth in the appended claims.

Although the invention is illustrated and described herein as embodied in an electronic circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single figure of the drawing is a diagrammatic, circuit diagram of an electronic circuit configuration according to an exemplary embodiment of the invention.

DESCRIPTION OF THE PREFERRED EMBODIMENTS

Referring now to the single figure of the drawing there is shown an exemplary embodiment of an inventive electronic circuit configuration 4 which is used in a dynamic synchronous semiconductor memory of the random access type (SDRAM). The electronic circuit configuration 4 contains two lines MDQ and cMDQ configured to be complementary with respect to one another and a detector device 8 that is allocated to the two lines MDQ and cMDQ. The detector device 8 detects a potential difference on the lines MDQ and cMDQ and controls a change in the line potentials in response to this. Each of the lines MDQ and cMDQ is allocated a switch 11, 11a driven by the detector device 8, specifically, the line MDQ is allocated the switch 11, and the line cMDQ is allocated the switch 11a. After actuation by the detector device 8, the switch 11, 11a connects the potential of the associated line MDQ or cMDQ to a reference-ground potential VCC which is coupled to the switch 11 or 11a. In this configuration, the switches 11 and 11a are formed by terminal transistors T1 and T2 whose gate connections 5 and 5a, respectively, are driven by the detector device 8 and whose electrode connections are coupled firstly to the associated line MDQ and cMDQ and secondly to the reference-ground potential VCC. The two lines MDQ and cMDQ are complementary with respect to one another, i.e. they each carry opposite logic signal levels "zero" or "one" if they are switched on; otherwise, they both carry the same precharge level 'PRECHARGE'. According to the preferred exemplary embodiment, the detector device 8 is formed by a signal memory circuit, a so-called latch circuit, whose input is coupled to the two lines MDQ and cMDQ and whose output is coupled directly to the control connections (gate connections) 5 and 5a of the switches 11 and 11a, respectively, and which is connected to the supply voltage VCC and ground VSS.

The way in which the circuit configuration 4 works is described below.

During a read cycle in a memory cell (this cell is not shown in more detail in FIG. 1), the memory cell is connected to the complementary bit lines BL and cBL, as a result of which one of these two bit lines in the bit line pair 1, which are firstly precharged to a neutral level, is discharged to a lower potential. A downstream sense amplifier 2 (SA) amplifies this signal and passes it to the detector device 8 via a data line pair 3, containing complementary data lines LDQ and cLDQ, and finally via the complementary lines MDQ and cMDQ. It is assumed below that the bit line BL carries a "zero" and the bit line cBL carries a "one". After the first sense amplifier 2 has been enabled by an enable line CSL (column select) and the detector device (latch circuit) 8 has been enabled by enable inputs ENB (enable), the potential difference on the bit line pair 1 is amplified by the first sense amplifier 2 and applied to control inputs 13 and 13a of opening transistors 14 and 14a in the latch circuit 8 via the data line pair 3 and the complementary lines MDQ and cMDQ. A potential difference on the control connections 13 and 13a now produces an imbalance within the flip-flop formed by transistors 15, 16, 15a and 16a, and an output DATA of the two outputs DATA and cDATA of the latch circuit 8, which are precharged to a predetermined reference-ground potential ("PRECHARGE"), is drawn to the zero potential VSS. The terminal transistor T1, whose control input 5 couples it directly to the output DATA, now turns on and charges the discharging Line MDQ, and hence LDQ as well, to the reference-ground potential VCC again.

As soon as the result of the evaluation of the potential difference on the two complementary lines MDQ and cMDQ is output via the outputs DATA and cDATA, this prevents further discharge of the complementary lines MDQ and cMDQ and starts automatic precharging to the reference-ground potential VCC. After this, the enable CSL and ENB for the latch circuit 8 can quickly be turned off again, and the circuit configuration is ready for a further assessment process.

I claim:

1. An electronic circuit configuration, comprising:
    two lines;
    a detector device connected to said two lines for detecting a potential difference on said two lines and controlling a change in line potentials on said two lines in response to the potential difference; and
    terminal transistors coupled to a reference potential, each of said two lines connected to one of said terminal transistors and said terminal transistors having gate connections driven by said detector device and electrode connections coupled firstly to said associated line of said two lines and secondly to the reference potential and, after being actuated by said detection device, each of said terminal transistors connects a potential of an associated line of said two lines to the reference potential, said detector device having a flip-flop circuitry and two input transistors, gate connections of said two input transistors being coupled to said two lines and outputs of said flip-flop circuitry being coupled directly to said gate connections of said terminal transistors.

2. The circuit configuration according to claim 1, wherein said two lines carry data signals which are complementary with respect to one another.

3. The circuit configuration according to claim 1, wherein said two lines are complementary bit lines in a synchronous dynamic semiconductor memory configuration of a random access type, and said detector device is a component cart of a sense amplifier allocated to said complementary bit lines.

4. The circuit configuration according to claim 1, wherein said two lines are complementary data lines in a synchronous dynamic semiconductor memory configuration of a random access type, and said detector device is a component part of a sense amplifier allocated to said complementary data lines.

* * * * *